United States Patent [19]

Yamamoto et al.

[11] Patent Number: 4,577,396

[45] Date of Patent: Mar. 25, 1986

[54] METHOD OF FORMING ELECTRICAL CONTACT TO A SEMICONDUCTOR SUBSTRATE VIA A METALLIC SILICIDE OR SILICON ALLOY LAYER FORMED IN THE SUBSTRATE

[75] Inventors: Naoki Yamamoto, Kawaguchi; Noriyuki Sakudo, Ohme, both of Japan

[73] Assignee: Hitachi, Ltd., Tokyo, Japan

[21] Appl. No.: 610,485

[22] Filed: May 15, 1984

[30] Foreign Application Priority Data

May 16, 1983 [JP] Japan ................................. 58-84221

[51] Int. Cl.⁴ .................... H01L 21/28; H01L 21/265; C23F 1/02
[52] U.S. Cl. .................... 29/576 B; 29/571; 29/578; 148/1.5; 148/187; 148/DIG. 140; 357/91; 427/88
[58] Field of Search ............ 29/576 B, 571, 578; 148/1.5, 187; 357/91; 427/88

[56] References Cited

U.S. PATENT DOCUMENTS

| | | | |
|---|---|---|---|
| 3,560,809 | 2/1971 | Terakado | 317/234 |
| 3,600,797 | 8/1971 | Bower et al. | 29/584 |
| 4,096,622 | 6/1978 | MacIver | 29/578 |
| 4,319,395 | 3/1982 | Lund et al. | 29/571 |
| 4,339,869 | 7/1982 | Reihl et al. | 29/576 B |
| 4,343,082 | 8/1982 | Lepselter et al. | 29/576 B |
| 4,385,433 | 5/1983 | Ozawa | 29/576 B |
| 4,389,257 | 6/1983 | Geipel, Jr. et al. | 148/1.5 |
| 4,458,410 | 7/1984 | Sugaki et al. | 29/591 |

OTHER PUBLICATIONS

Ting et al., J. Appl. Phys. 54 (1983) 937.
Brack et al., IBM-TDB, 19 (1976) 2592.
Nagasawa et al., Jap. Jour. Appl. Phys. 22 (1983) p. L-57.
Crowder et al., IEEE-Trans. Electron Device, ED26 (1979) 369.

*Primary Examiner*—Upendra Roy
*Attorney, Agent, or Firm*—Antonelli, Terry & Wands

[57] ABSTRACT

A silicide layer or silicon alloy layer is formed within a surface region of an impurity-doped region on the surface of a semiconductor substrate by implanting and heating any of those metals which can form silicides or silicon alloys with silicon upon heating.

The peel of a metallic electrode or wiring can thus be prevented, and the electrode or wiring can be directly formed on the semiconductor substrate.

30 Claims, 6 Drawing Figures

METHOD OF FORMING ELECTRICAL CONTACT TO A SEMICONDUCTOR SUBSTRATE VIA A METALLIC SILICIDE OR SILICON ALLOY LAYER FORMED IN THE SUBSTRATE

BACKGROUND OF THE INVENTION

This invention relates generally to a method of producing a semiconductor device and, more particularly, to a method of producing a semiconductor device including a thin diffusion layer having low resistance and metallic electrodes and wirings that are electrically connected to the diffusion layer.

As is well known in the art, the thickness of an impurity-doped region of an MIS semiconductor device has been markedly reduced with a remarkable increase in the integration density of the semiconductor device in the past few years. It is expected, for example, that an As-doped region in a 1-mega bit dynamic memory is from about 0.1 to 0.2 $\mu$m.

When the impurity-doped region becomes extremely thin as described above, however, the resistance in the surface direction of the impurity-doped region becomes extremely great. The resistance in the surface direction of a 0.1 $\mu$m-thick impurity-doped region, for example, is about 100$\Omega/\square$.

Accordingly, the source-drain resistance of the MIS transistor becomes great while the channel conductance becomes small, so that the high speed operation of the transistor becomes difficult.

Since the impurity-doped region is also used as a wiring of the semiconductor device, signal transmission will be retarded if the resistance becomes great as described above and, from this point, too, the high speed operation is impeded.

In a bipolar semiconductor device, too, the thickness (depth) of the emitter is ever-decreasing and is from 0.1 to 0.2 $\mu$m at present. In the same way as in the MIS semiconductor device described above, therefore, the high speed operation of the bipolar semiconductor device is impeded. For this reason, it has been strongly desired to decrease the emitter resistance.

Polycrystalline silicon has been widely used in the past for the gate electrode of the MIS semiconductor device and its wirings. As the integration density has been increased, however, the high resistance of the polycrystalline silicon renders a serious problem for the high speed operation of the device, and the use of tungsten, molybdenum or their silicides for the gate electrode and the wirings has been proposed.

When the gate electrode and the wirings are composed of the polycrystalline silicon, direct contact with a silicon substrate has been used widely in order to accomplish high integration density.

Connection of the gate electrode of a load transistor to a driving MOS transistor in an E/D MOS inverter circuit, for example, has been made by direct connection with the silicon substrate.

If the wirings and gate electrode made of Mo or W are directly connected to silicon, however, the metal and silicon cause heterogeneous reaction at the portion where they are in contact with each other, and hence peel off. When the gate electrode made of W or Mo is formed or when the wiring made of W or Mo is used, therefore, it is necessary to avoid the direct contact between the metal and silicon, and this renders a critical problem in order to attain high integration density of the device.

SUMMARY OF THE INVENTION

It is, therefore, an object of the present invention to provide a method of producing a semiconductor device which eliminates the problem with the prior art described above, and has a thin impurity-doped region having low resistance.

It is another object of the present invention to provide a method of producing a semiconductor device which can form those electrodes and wirings which are brought into high ohmic contact with a thin impurity-doped region without destroying the region.

It is still another object of the present invention to provide a method of producing ohmic contacts to thin impurity-doped regions of a semiconductor substrate, or Schottky contacts to a semiconductor substrate.

It is a further object of the present invention to provide electrical connection metals, for forming electrodes and wirings, to a semiconductor substrate, while preventing peeling of the electrode and/or wiring from said substrate.

To accomplish these objects, the present invention implants the ion of such a metal that can react with silicon and can form a silicide or its alloy, into a desired surface region of a silicon substrate, so that the silicide or silicon alloy layer is interposed between an electrode or wiring and the silicon substrate in order to prevent the peel of the electrode or wiring, and to establish satisfactory connection between the electrode or wiring and the silicon substrate.

DESCRIPTION OF THE PREFERRED EMBODIMENTS

Figure 1A:
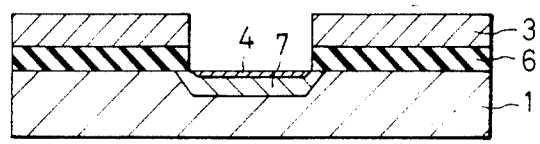
FIGS. 1a and b, 2a and b and 3a and b of the accompanying drawings are sectional views of a semiconductor device useful for explaining step-wise the method of producing semiconductor devices in accordance with different embodiments of the present invention.

When an Mo or W film is deposited onto a silicon single crystal substrate and is then heat-treated, heterogeneous reaction develops between Mo or W and Si, and this reaction causes volume shrinkage of about 20 to about 25% of the reaction region, and hence the Mo or W film peels off from the silicon substrate.

An impurity such as P is generally doped in a dose of about $10^{20}/cm^3$ into the impurity-doped region. If the reaction between Mo or W and Si occurs as described above, the impurity thus doped migrates into the reaction layer, and the impurity concentration of the impurity-doped region drops to about $10^{17}/cm^3$.

It was found that even if the Mo or W film did not peel from the silicon substrate, the contact between the electrode and the silicon substrate exhibited Schottky contact and, obviously, no ohmic electrode could be formed. It was also found that when a metal capable of forming a silicide or alloy with Si, such as Mo, W, Ti or the like, was ion-implanted into the impurity-doped region on the surface of the silicon substrate, then was heat-treated at 400° to 700°, and thereafter was heat-treated at about 1,000° C. after evaporation deposition of the metal, the metal did not peel and the drop of the P concentration doped into the substrate could be minimized.

When a Schottky diode was produced by implanting the W or Mo ion in a depth of about 5 nm, for example, into an n-type silicon substrate, then heat-treating the substrate to form a silicide layer and forming an aluminum electrode, the variance of the forward voltage of the diode was found to be less. Even after the heat-treatment test at 300° to 400° C., the voltage change hardly occurred. When the diode was examined by a scanning electron microscope after removing aluminum using an etching solution, local reaction (called generally "alloy pit"), that occurred when aluminum was brought into contact with the silicon substrate, was not found occurring.

In other words, the peel of the electrode and the wiring can be prevented and ohmic contact can be formed with the silicon substrate when the metal capable of reacting with silicon and forming a silicide or alloy with silicon, such as Mo, W or Ti, is ion-implanted into the impurity doped region on the surface of the silicon substrate, and after the heat-treatment of the substrate to form the silicide or alloy layer, the electrode and wiring made of W, Mo or Al are formed on the resulting silicide or alloy layer.

Since the silicide or silicon alloy layer is interposed between the electrode or the wiring and the silicon substrate, there is no possibility that the heterogeneous reaction, that would otherwise occur when the electrode and wiring made of W or Mo are directly formed on the silicon substrate, and hence the doped region resulting from the heterogeneous reaction, occur. Incidentally, the formation of the silicide or alloy by heating may be effected after the formation of the electrode and the wiring.

An extremely excellent Schottky junction can be formed by forming first the silicide or silicon alloy layer on the semiconductor substrate, in which the impurity-doped region is not formed, and then forming an aluminum electrode or the like on the silicide or alloy layer.

EXAMPLE 1

This example illustrates a case in which a W electrode is directly formed on an As-doped region which is formed inside the surface region of a silicon substrate.

The surface of a p-type (100) silicon substrate having resistivity of 10Ω·cm was oxidized to form a 300 nm-thick oxide film 6, as shown in FIG 1a.

Arsenic ion was selectively implanted into a desired portion of the silicon substrate 1, with the oxide film 6 acting as an ion implantation mask, at an acceleration voltage of 80 KeV and a dose of $5 \times 10^{15}/cm^2$, to form an As-doped region 7.

After a 300 nm-thick aluminum film 3 was formed over the entire surface by known sputtering technology, the aluminum film 3 at the portion at which a contact aperture was to be formed was selectively removed, and the portion on which the oxide film 6 was exposed was further removed so as to expose As-doped region 7.

Figure 1B:
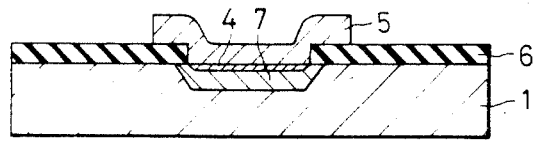

Tungsten ion was implanted using the aluminum film 3 as the mask at an acceleration voltage of 100 KeV and a dose of $5 \times 10^{15}/cm^2$ to form an implantation region 4. The aluminum film 3 was removed using a phosphoric acid type etching solution, followed by heat-treatment at 700° C. for 30 minutes. A 300 nm-thick W film 5 was then formed by sputtering technology, as shown in FIG. 1b. The unnecessary portions of this W film 5 were selectively removed by reactive sputter etching in a shape of an electrode. Heat-treatment was then effected at 1,000° C. for 30 minutes. The W film 5 thus formed did not at all peel, and the surface of the W film at the portion where it was in contact with the silicon substrate 1 was flat and smooth. On the other hand, when the W film was formed without W ion implantation, the W film was likely to peel, and even if it did not peel, the surface of the W film became corrugated and a satisfactory W electrode could not be obtained.

The characteristics of the n+p diode formed in this example were found normal.

The depth of the As-doped region 7 after heat-treatment was about 0.2 μm.

In this example, when the depth of the As-doped region 7 was set to 0.1 μm, heat-treatment was made at 1,000° C. for 30 minutes after W ion implantation and the resistance of the resulting doped layer was measured, the resistance was as low as from 30 to 50Ω/□ and was found sufficiently low for a practical application.

EXAMPLE 2

This example illustrates a case in which a satisfactory diode is formed by preventing the reaction between an aluminum electrode and a silicon substrate.

Figure 2A:
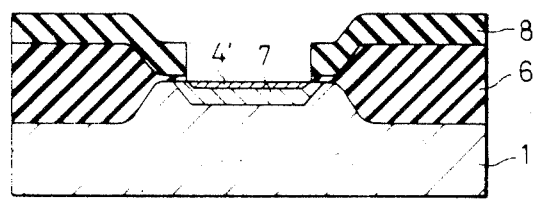
Figure 2B:
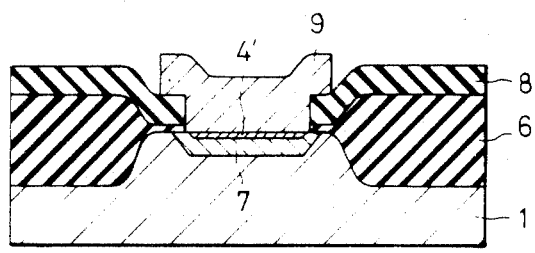

A 500 nm-thick oxide film 6 for separating devices was formed on a p-type (100) silicon substrate 1 having a resistivity of 10Ω·cm, as shown in FIG. 2a, and a 20 nm-thick oxide film was formed at the portions other than the oxide film 6. Arsenic ion was implanted at an acceleration voltage of 80 KeV and a dose of $5 \times 10^{15}/cm^2$ to form an n+ layer 7. A silicate glass film 8 was deposited in a thickness of 500 nm, and the glass film 8 at a desired portion was selectively removed by dry etching to bore a contact hole. Tungsten ion was implanted at an acceleration voltage of 100 KeV and a dose of $5 \times 10^{15}/cm^2$ to form an implantation layer 4'. Next, the surface layer of the silicate glass film 8 was thinly removed by a hydrofluoric acid type etching solution, and an aluminum electrode 9 was formed by heat-treatment at 950° C. for 30 minutes, as shown in FIG. 2b. Generally, about 1% of silicon was contained in aluminum in order to prevent the occurrence of the alloy pit, but this example used pure aluminum. When heat-treatment was carried out at temperatures within the range of from 300° C. to 400° C. for 20 to 30 hours, the junction leakage of the n+p diode, that would presumably occur with the occurrence of the alloy pit, did not take place at all and a diode having excellent characteristics could be obtained.

EXAMPLE 3

In Example 1, As ion and W ion were implanted in succession to form the n+ layer 7 and the ion implantation layer 4. After heat-treatment at 950° C. for 30 minutes to form the W silicide layer, the side surface of the As-doped layer 7 was exposed by angle polishing. When the exposed side surface was examined, the n+ layer was found formed around the W silicide layer. When this n+ layer was observed by an ion microanalyzer, it was found to be a layer containing large quantities of As.

EXAMPLE 4

This example illustrates a case in which the present invention is applied to the production of an MOS transistor having its source and drain formed by Schottky contact.

Figure 3A:
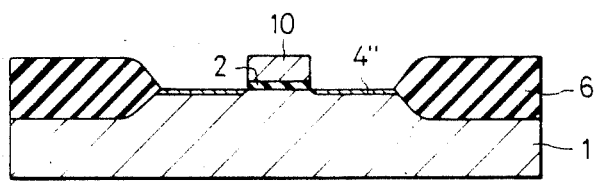
Figure 3B:
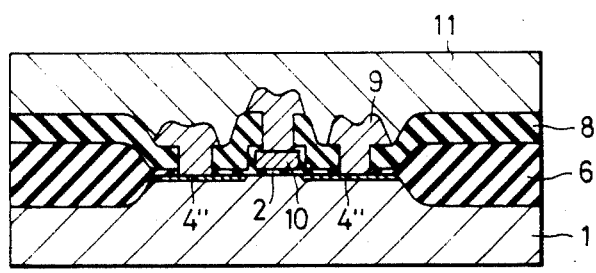

After a 500 nm-thick oxide film 6 for separating devices was formed on an n-type (100) silicon substrate 1 having a resistivity of 5Ω·cm, as shown in FIG. 3a, a 20 nm-thick gate oxide film 2 was formed. Next, P-doped polycrystalline silicon was deposited, and unnecessary portions were removed by reactive sputter etching to form a 1 μm-wide gate electrode 10. The thin oxide film 2 around the gate electrode 10 was removed by a hydrofluoric acid type etching solution, and W ion was implanted at 100 KeV and a dose of $5\times10^{15}/cm^2$ to form an implantation layer 4''. Next, heat-treatment was made at 800° C. for 30 minutes in a nitrogen atmosphere so as to change the implanted W ion into tungsten silicide, and the surface of the gate electrode 10 consisting of the silicon substrate 1 and polycrystalline silicon was oxidized thermally at 950° C. Phosphosilicate glass 8 was further deposited as an inter-layer insulating film. Next, a contact hole was bored by known dry etching technology, such as reactive sputter etching. In this case, the W ion implanted layer was hardly etched, even though the phosphosilicate glass did not exist. Subsequently, an aluminum electrode 9 and a device protecting insulating film 11 were formed to complete a Schottky MOS transistor. (In this example, since no impurity-doped region was formed inside the surface region of the semiconductor substrate, hence Schottky contact or junction, but not ohmic contact, was formed at the interface between the aluminum electrode 9 and the silicon substrate 1.)

It was confirmed that the resulting transistor exhibited normal MOS transistor characteristics.

In the present invention, those metals which can form silicides or alloys with silicon upon heating can be used as the metals whose ions are to be implanted, and examples of such metals are W, Mo, Al, Ti, Ta and the like.

The dose of ion implantation of these metals varies depending upon the kind of the metal into which the ion is to be implanted, but the peel of the electrode and the wiring can be effectively prevented if the dose is at least $5\times10^{14}/cm^2$. If the dose is at least about $5\times10^{16}/cm^2$, the resistance of the impurity-doped region can be kept at a sufficiently low value in addition to the prevention of the peel of the electrode and the wiring. Hence, such a dose is preferred, particularly when the depth of the impurity-doped region is small.

The greater the dose, the better the result; but the upper limit of the dose is determined mainly by the limitation to the production process, such as the ion implantation time, and the upper limit is substantially about $1\times10^{18}/cm^2$. If an ion implantation apparatus having higher efficiency is developed or other conditions for the ion implantation are improved, however, the dose may be above $1\times10^{18}/cm^2$.

A preferred result could be obtained if the acceleration voltage for the ion implantation is from about 40 to about 150 KeV.

The heat-treating temperature for forming the silicide or alloy with silicon varies depending upon the kind of metal whose ion is imolanted. In the case of W and Mo, for example, their silicides can be formed if they are heated to at least 600° C. and to at least 400° C., respectively.

If the heat-treatment is effected after the ion implantation in accordance with the present invention, the silicide or silicon alloy can be formed at a temperature by about 100° to about 150° C. lower than the heat-treating temperature of the conventional method which effects heat-treatment after forming the metallic film on silicon, irrespective of the kind of metals. Accordingly, the method of the present invention is by far easier than the conventional method.

No problem occurs in forming the silicide or silicon alloy, even if the heat-treating temperature after the ion implantation is extremely high, but if it is too high, adverse influences, such as the deformation of the p-n junction that has been formed already, would occur. For this reason, it is advisable to keep the heat-treating temperature at about 1,200° C. or below.

As can be understood clearly from the description described above, the present invention can effectively prevent the peel of the electrode and wiring made of a metal, so that the metallic electrode and wiring can be directly formed on the silicon substrate.

Since the silicide or silicon alloy layer is formed within the surface region of the impurity-doped region, the resistance of the impurity-doped region can be kept as low as from about 20 to about 50Ω/□, even if the depth of the impurity-doped region is as small as from about 0.1 to about 0.2 μm.

For the reason described above, the present invention is extremely effective for increasing the integration density and operation speed of MOS·LSIs, and provides the effect of speeding up the access time of a static memory using complementary MOS (C-MOS) transistors.

When W or Mo is used for the electrode and the wiring, the break-down of the junction can be prevented by the silicide or silicon alloy layer, so that the depth of the impurity-doped region can be extremely reduced. Hence the present invention is particularly effective to miniaturize semiconductor devices and to increase their integration density.

When Al is used for the wiring and the electrode, they can be directly formed on the silicon substrate, on the formed region, without the necessity of an intermediate layer, so that the present invention is extremely effective for the production of semiconductor devices.

In the embodiments described already, W is used for the ion-implantation, but it has been confirmed that the metals that can be used for the ion-implantation in the present invention are those which can form silicides or silicon alloy upon heating, such as Mo, Ta, Ti, Al and the like, besides W.

While we have shown and described several embodiments in accordance with the present invention, it is understood that the present invention is not limited to the previously disclosed embodiments, but is susceptible of numerous changes and modifications as known to one having ordinary skill in the art and we, therefore, do not wish to be limited to the details shown and described herein, but intend to cover all such modifications as are encompassed by the scope of the appended claims.

What is claimed is:

1. A method of providing an electrical connection to a surface of a semiconductor substrate, comprising the step of: inplanting ions, of metal which can form metallic silicides or silicon alloys with silicon upon heating, into a desired portion of an impurity-doped region of a semiconductor substrate, said desired portion extending to the surface of the substrate, to form an ion-implanted region in the impurity-doped region; forming metallic silicides or silicon alloys in said ion-implanted region by heating; and forming a wiring layer or electrode in electrical connection with and on the surface of said ion-implanted region, whereby an ohmic contact is formed without peeling of the wiring layer or electrode from the ion-implanted region and wherein any decrease in the impurity concentration in the impurity-doped region is minimized.

2. The method of providing an electrical connection as defined in claim 1, wherein the metals are at least one selected from the group consisting of W, Mo, Ti, Ta and Al.

3. The method of providing an electrical connection as defined in claim 1, wherein the wiring layer or electrode is made of a material selected from the group consisting of W, Mo and Al.

4. The method of providing an electrical connection as defined in claim 1, wherein the formation of said metallic silicide or silicon alloy is effected before the forming of said wiring layer or electrode.

5. The method of providing an electrical connection as defined in claim 1, wherein the formation of said metallic silicide or silicon alloy is effected after the forming of said wiring layer or electrode.

6. The method of providing an electrical connection as defined in claim 1, wherein an acceleration voltage for the ion implantation is from about 40 to about 150 KeV.

7. The method of providing an electrical connection as defined in claim 1, wherein the dose of the ion implantation is at least about $5 \times 10^{14}/cm^2$.

8. The method of providing an electrical connection as defined in claim 1, wherein the ions are Mo ions, and wherein the heating temperature is from about 400° to about 1,200° C.

9. The method of providing an electrical connection as defined in claim 1, wherein the ions are W ions, and wherein the heating temperature is from about 600° to about 1,200° C.

10. The method of providing an electrical connection as defined in claim 1, wherein the semiconductor substrate is made of silicon.

11. The method of providing an electrical connection as defined in claim 1, wherein said impurity-doped region extends at least 0.1 μm into the semiconductor substrate.

12. The method of providing an electrical connection as defined in claim: 1, wherein said wiring layer or electrode is formed directly on the surface of said ion-implanted region.

13. The method of providing an electrical connection as defined in claim 7, wherein the dose is at least about $5 \times 10^{16}/cm^2$.

14. The method of providing an electrical connection as defined in claim 11, wherein said impurity-doped region extends 0.1–0.2 μm into the semiconductor substrate.

15. A method of producing an ohmic contact to an impurity-dope region of a semiconductor substrate, comprising the steps of: implanting ions, of a metal that can form metallic silicides or silicon alloys with silicon upon heating, into a desired portion of said impurity-doped region of the semiconductor substrate, to form an ion-implanted region in the substrate; forming a metallic silicide of silicon alloy, of said metal and silicon, in the semiconductor substrate by heating; and forming a wiring layer or electrode, in electrical connection to the ion-implanted region, on the surface of said ion-implanted region, whereby said ohmic contact is formed without peeling of the wiring layer or electrode from the ion-implanted region and wherein any decrease in the impurity concentration in the impurity-dope region is minimized.

16. The method of producing an ohmic contact as defined in claim 15, wherein the semiconductor substrate is made of silicon.

17. A method of producing a semiconductor device comprising the steps of: forming a semiconductor element, including at least one impurity-dope region, in a semiconductor substrate; implanting ions, of metals which can form metallic silicides or silicon alloys with silicon upon heating, into a desired portion of said impurity-dope region, to form an ion-implanted region in said semiconductor substrate; forming said metallic silicide or silicon alloy in said ion-implanted region by heating; and forming a wiring layer or electrode, connected electrically to the ion-implanted region, on the surface of said ion-implanted region, whereby an ohmic contact is formed to the ion-implanted region without peeling of the wiring layer or electrode from the ion-implanted region and wherein any decrease in the impurity concentration in the impurity-doped region is minimized.

18. The method of producing a semiconductor device as defined in claim 17, wherein the formation of said metallic silicide or silicon alloy is effected after the forming of said wiring or electrode.

19. The method of producing a semiconductor device as defined in claim 17, wherein the ions implanted are ions of at least one metal selected from the group consisting of W, Mo, Ti, Ta and Al.

20. The method of producing a semiconductor device as defined in claim 17, wherein an acceleration voltage for the ion implantation is from about 40 to about 150 KeV.

21. The method of producing a semiconductor device as defined in claim 17, wherein the dose of the ion implantation is at least about $5 \times 10^{14}/cm^2$.

22. The method of producing a semiconductor device as defined in claim 17, wherein the ions are Mo ions, and wherein the heating temperature is from about 400° to about 1,200° C.

23. The method of producing a semiconductor device as defined in claim 17, wherein the ions are W ions, and wherein the heating temperature is from about 600° to about 1,200° C.

24. The method of producing a semiconductor device as defined in claim 17, wherein said wiring layer or electrode is made of a material selected from the group consisting of W, Mo and Al.

25. The method of producing a semiconductor device as defined in claim 17, wherein the semiconductor substrate is made of silicon.

26. The method of producing a semiconductor device as defined in claim 17, wherein the formation of said metallic silicide or silicon alloy is effected before the forming of said wiring layer or electrode.

27. The method of producing a semiconductor device as defined in claim 21, wherein the dose is at least about $5 \times 10^{16}/cm^2$.

28. A method of producing an MOS transistor comprising the steps of: forming a gate electrode for said MOS transistor on a gate oxide film on a semiconductor substrate; implanting ions, of metals which can form metallic silicides or silicon alloys with silicon upon heating, into desired portions of a surface region of said semiconductor substrate, said desired portions being positioned adjacent the region of the substrate beneath said gate electrode at each side thereof, to form ion-implanted regions in said semiconductor substrate; forming the metallic silicide or silicon alloy in said ion-implanted regions by heating; and forming a metallic film on the surface of said ion-implanted regions so as to form Schottky junctions as the source and drain of the MOS transistor.

29. The method of producing an MOS transistor as defined in claim 28, wherein the metal is selected from the group consisting of Mo, Ta, Ti and W.

30. The method of producing an MOS transistor as defined in claim 28, wherein the semiconductor substrate is made of silicon.

* * * * *